United States Patent [19]
Ellis

[11] Patent Number: 5,898,899
[45] Date of Patent: Apr. 27, 1999

[54] RF BROADBAND AMPLIFIER BYPASS METHOD AND APPARATUS

[75] Inventor: William H. Ellis, Mercer Island, Wash.

[73] Assignee: Thomas & Betts International, Inc., Sparks, Nev.

[21] Appl. No.: 08/758,182

[22] Filed: Nov. 25, 1996

[51] Int. Cl.[6] .............................. H04H 1/00; H04N 7/10
[52] U.S. Cl. ................. 455/3.1; 348/6; 348/192
[58] Field of Search .......................... 348/6, 180, 192; 455/8, 3.1, 6.1; 333/100, 101, 109, 111; H04N 7/10

[56] References Cited

U.S. PATENT DOCUMENTS

| | | | |
|---|---|---|---|
| 4,236,250 | 11/1980 | Huffman | 455/49 |
| 4,365,249 | 12/1982 | Tabata | 340/825.3 |
| 4,427,995 | 1/1984 | Naito | 358/86 |
| 4,514,757 | 4/1985 | Noji et al. | 358/86 |
| 4,630,113 | 12/1986 | Long | 358/121 |
| 4,963,966 | 10/1990 | Harney et al. | 358/349 |
| 4,982,440 | 1/1991 | Dufresne et al. | 455/4 |
| 5,020,134 | 5/1991 | Pecaut | 455/67 |
| 5,047,732 | 9/1991 | Tanaami et al. | 330/295 |
| 5,233,652 | 8/1993 | Huang et al. | 380/7 |
| 5,323,462 | 6/1994 | Farmer | 380/7 |
| 5,331,412 | 7/1994 | Farmer et al. | 348/5.5 |
| 5,434,610 | 7/1995 | Loveless | 348/6 |

FOREIGN PATENT DOCUMENTS

| | | | |
|---|---|---|---|
| 3939-135 | 4/1991 | Germany | H04N 7/10 |
| 5-219507 | 8/1993 | Japan | H04N 7/173 |

OTHER PUBLICATIONS

English translation of Japanese patent application HEI 5[1993] 219507, Aug. 1993.

English translation of German patent application DE 3939–135, Apr. 1991.

*Primary Examiner*—Andrew I. Faile
*Assistant Examiner*—John W. Miller
*Attorney, Agent, or Firm*—Weingarten, Schurgin, Gagnebin & Hayes LLP

[57] ABSTRACT

A method and apparatus are disclosed for bypassing a first RF broadband amplifier in a CATV network so as to permit substitution of a second broadband amplifier for the first amplifier to permit repair, replacement and/or analysis of the bypassed first RF amplifier. A switching circuit is employed to rapidly substitute the second amplifier for the first amplifier and to reinsert the repaired of replaced first amplifier in the CATV network following maintenance thereof. Bypassing of the first amplifier and utilization of the second amplifier in its stead allows maintenance to be performed on the first amplifier without disruption of service to the portion of the network downstream of the first amplifier.

10 Claims, 3 Drawing Sheets

RF BROADBAND AMPLIFIER BYPASS METHOD AND APPARATUS

FIELD OF THE INVENTION

This invention relates to RF broadband distribution networks, such as CATV networks and more particularly to a method and apparatus for substituting one RF broadband amplifier for another broadband amplifier with minimal disruption to subscribers.

CROSS-REFERENCE TO RELATED APPLICATION

Not applicable

STATEMENT REGARDING FEDERALLY SPONSORED RESEARCH OR DEVELOPMENT

Not applicable

BACKGROUND OF THE INVENTION

Broadband systems such as CATV systems are employed widely throughout this country and around the world. Such systems typically employ large numbers of RF amplifiers for signal distribution. Typical broadband amplifiers, such as CATV amplifiers, are contained within a housing or chassis which have an input jack, an input test jack for monitoring a replica of the signal presented to the input of the broadband amplifier, an exit jack and an exit test jack for monitoring a replica of the signal appearing at the output of the broadband amplifier. The input jack is typically coupled to the input of the broadband amplifier and the output of the broadband amplifier is typically connected to the exit jack. Where multiple amplifiers are contained within one housing, the above described jacks are replicated.

It will be appreciated that decoupling or removal of an amplifier which is disposed in a serial path within a broadband network will prevent the distribution of the signal downstream of the respective amplifier. Accordingly, when maintenance is being performed, and an amplifier is being replaced or repaired in a broadband network, service to all downstream subscribers or users is disadvantageously interrupted. To minimize disruption of service to subscribers or system users, amplifiers are often replaced or repaired in the middle of the night when the fewest subscribers are using the system. The failure of an amplifier necessarily requires immediate attention. As broadband systems increasingly become used for telephone and other data services, in addition to television service, there will exist an increasing need to be able to maintain the operation of the CATV network during maintenance and to be able to freely service broadband amplifiers disposed throughout the CATV network with minimal disruption to subscribers downstream of the affected amplifier(s). Such is also desirable in a CATV network as the disruption of service poses an annoyance to subscribers.

SUMMARY OF THE INVENTION

In accordance with the present invention, a method and apparatus are disclosed for substituting in a CATV network one broadband amplifier for another broadband amplifier in a rapid and simple manner so as to avoid disruption of service to subscribers downstream of the respective amplifier. A switching circuit having first and second states is disposed within the housing or chassis of a CATV amplifier. In one switching state, the input and output of an RF amplifier disposed within the housing are coupled to respective input and exit jacks mounted on the housing. Amplitude reduced replicas of the signals appearing at the input and exit jacks are coupled to input and exit test jacks to permit monitoring of the CATV signal presented to the input of the broadband amplifier within the housing and the output of the broadband amplifier within the housing while the amplifier is connected within the network.

In the second switching state, the amplifier within the housing is decoupled from both the input and exit jacks and the input and exit jacks are switchably coupled to the respective input and exit test jacks. The input of a substitute RF broadband amplifier may thus be coupled to the input test jack and the output of the substituted amplifier coupled to the exit test jack to effectively interpose the substitute amplifier in the network in place of the amplifier disposed within the housing or chassis.

The switching circuit may comprise relays activated by an appropriated relay coil energization voltage or alternatively, may be electronic switches such as bipolar OR field effect transistors suitably actuated.

BRIEF DESCRIPTION OF THE OF THE DRAWING

The invention will be more fully understood by reference to the following Detailed Description of the Invention in conjunction with the drawing of which:

FIG. 1 is an exemplary block diagram of a portion of a prior art CATV network;

FIG. 2. is a diagram of a prior art broadband amplifier; and

FIG. 3 is a diagram illustrating the broadband amplifier schematic and assembly in accordance with the present invention.

DETAILED DESCRIPTION OF THE INVENTION

Figure 1:
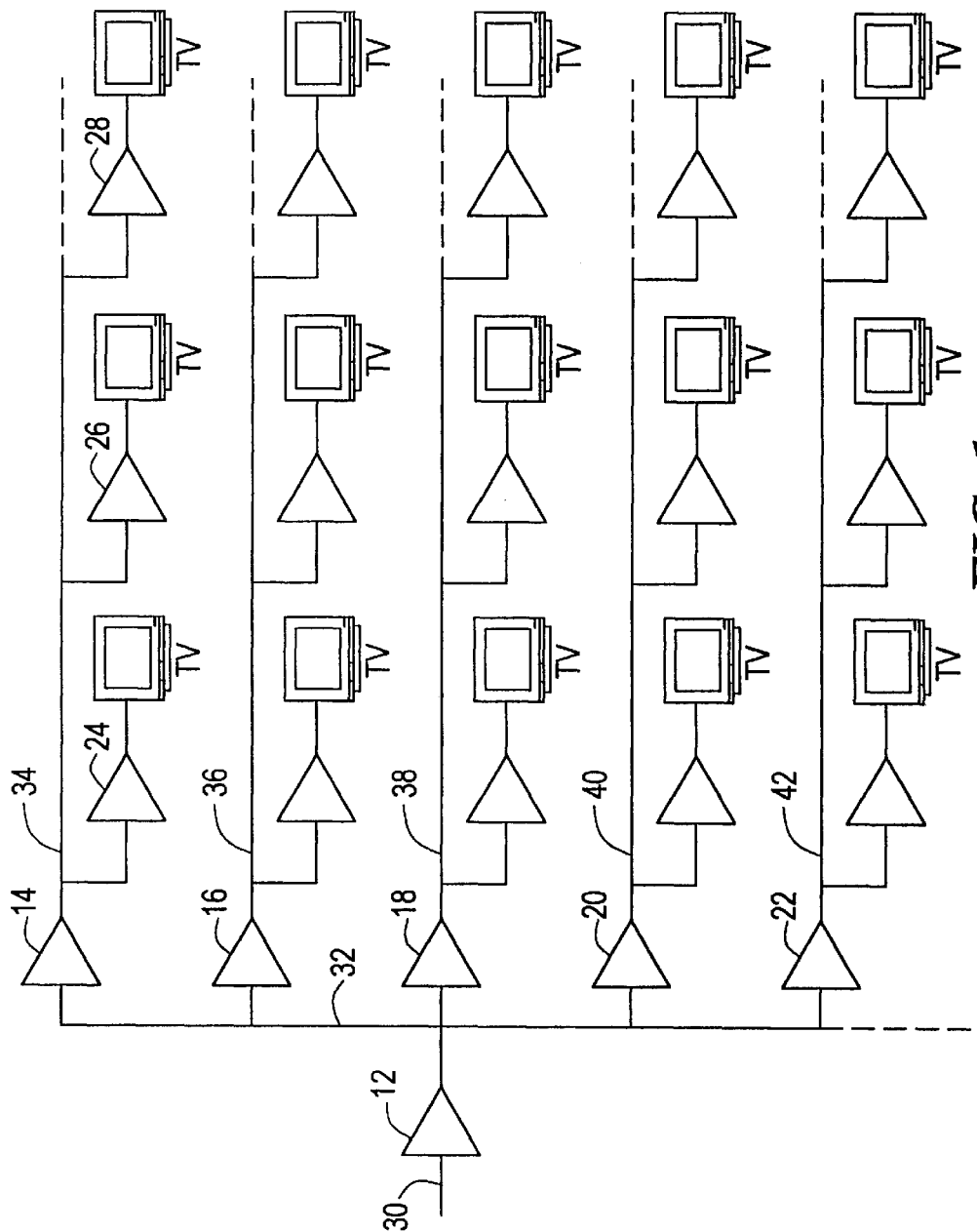

FIG. 1 is illustrative of a prior art Cable Television (CATV) Network 10 which includes a broadband amplifier 12 feeding broadband distribution amplifiers 14, 16, 18, 20 and 22. Broadband distribution amplifier 12, feeds a series of drop amplifiers such as drop amplifiers 24, 26 and 28 which present the cable tv signal to a subscriber. More specifically, amplifier 12 receives a signal over cable 30 and drives the cable 32. Distribution amplifiers 14, 14, 18, 20 and 22 receive signal over cable 30 and drive cables 34, 36, 38, 40 and 42 respectively. Drop amplifiers 24, 26, 28, . . . receive signal over cable 34. For reference purposes herein, cables and amplifiers which drive the input of a given amplifier are deemed to be upstream of the respective amplifier and those cables and amplifiers which receive signal from the output of a given amplifier are considered to be downstream of that amplifier.

It will be appreciated that the failure or removal of any amplifier in the network will result in the disruption of service to all subscribers downstream of the respective amplifier. Accordingly it is desirable to be able to minimize the downtime of to network for subscribers downstream of any amplifier which has either failed or must be removed from the network for analysis or service.

Figure 2:
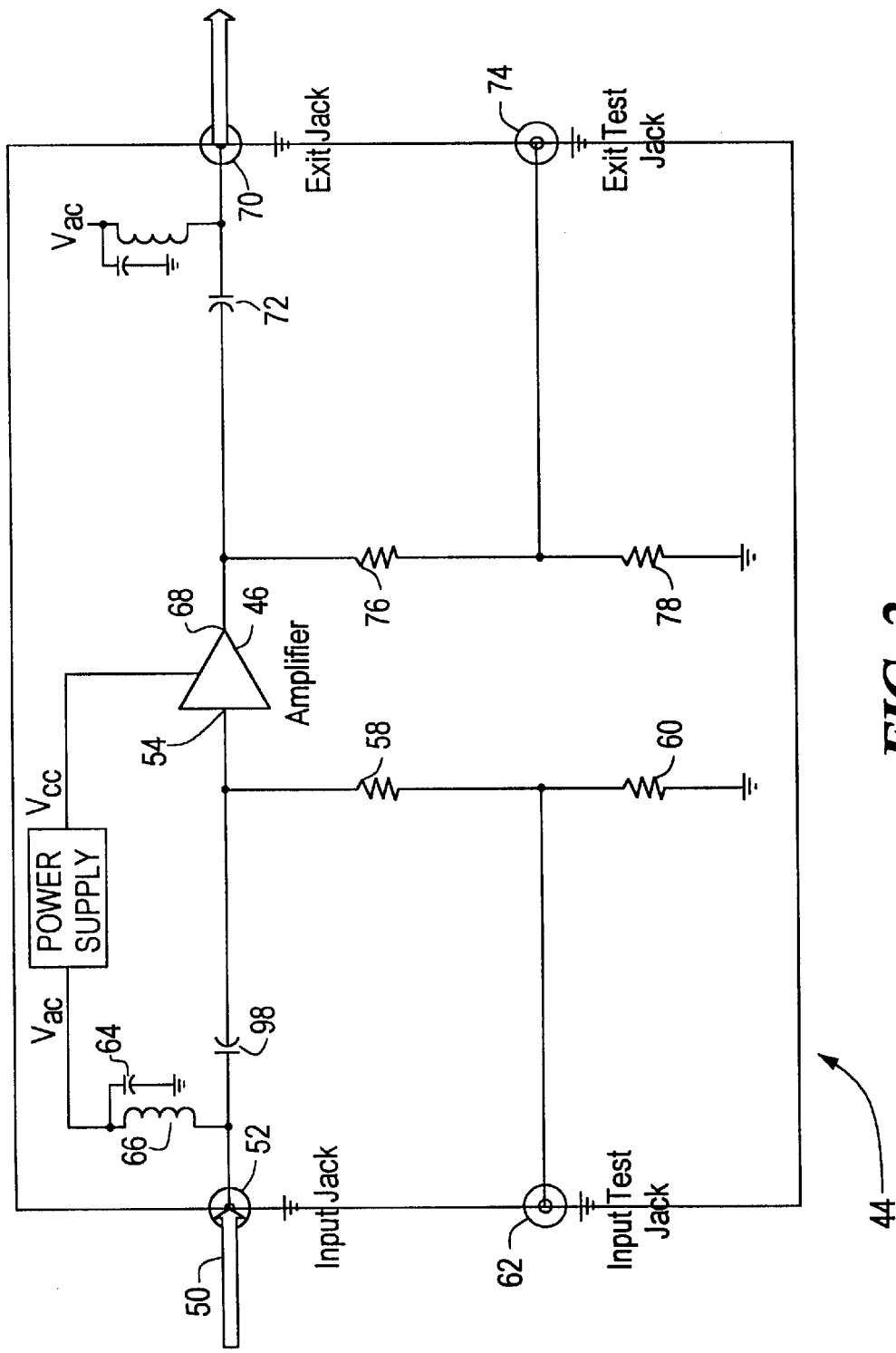

Referring to FIG. 2, a typical prior art RF broadband amplifier assembly 44 is depicted. An RF broadband amplifier 46, is disposed within a housing or chassis 48. CATV signal is received over a cable 50 at an input jack 52, which is typically a coaxial connector. The RF signal is coupled to the input 54 of the RF amplifier 46 through a coupling capacitor 56. The signal presented to the input 54 of the RF amplifier 46 is also coupled to a voltage divider comprising resistors 58 and 60. An input test jack 62 is coupled to resistors 58 and 60 and is utilized as a test point for analyzing and/or monitoring the input signal to the RF amplifier 54. Alternatively, the input test jack 62 may be coupled to a directional coupler (not shown) as is known in the art.

The CATV signal also contains a low frequency AC component in the range of 50 to 60 hz. As illustrated in FIG. 2, the received CATV signal is coupled to an inductor 66 which passes the low frequency AC component of the CATV signal to the input of an AC to DC power supply 67. While the power supply 67 is illustrated as having a unipolar output (Vcc), the power supply 67 may have bipolar outputs (Vcc and Vss—not shown) or any suitable combination of voltages needed to run power the amplifier 46 and any other components disposed within the housing. A decoupling capacitor 64 is provided to filter high frequency RF components from the low frequency AC signal component. The AC voltage is also conveyed downstream to subsequent amplifiers via inductor 75. Decoupling capacitor 77 is provided to filter undesirable high frequency components from the AC signal component.

The output 68 of the RF Amplifier 46 is coupled to the exit jack 70 through a coupling capacitor 72. The exit jack, like the input jack, typically comprises a coaxial connector. Additionally, the output 68 of the amplifier 46 provides an output to the exit test jack 74 through a voltage divider formed by resistors 76 and 78 or alternatively, through a directional coupler (not shown) as is known in the art. The signal present at the exit test jack thus may be employed to monitor the output of the RF amplifier 46 and to compare the output 68 to the input 54 for test purposes. While the typical prior art RF amplifier assembly allows monitoring of the inputs and outputs of the operation of a given amplifier, should it be necessary to remove or repair the amplifier, it is necessary to disassemble the amplifier housing, replace or repair the amplifier and reassemble the housing. During at least a portion such period, the subscribers downstream of the respective amplifier typically have their service interrupted. While a single amplifier 46 is illustrated within the housing 46 having a pair of input and exit jacks 52, 70 and a pair of test jacks 62, 74, amplifier assemblies also exist which contain multiple rf broadband amplifiers. In some of those assemblies, the amplifiers have multiple sets of input, exit, input test and exit test jacks, one set for each amplifier.

Figure 3:
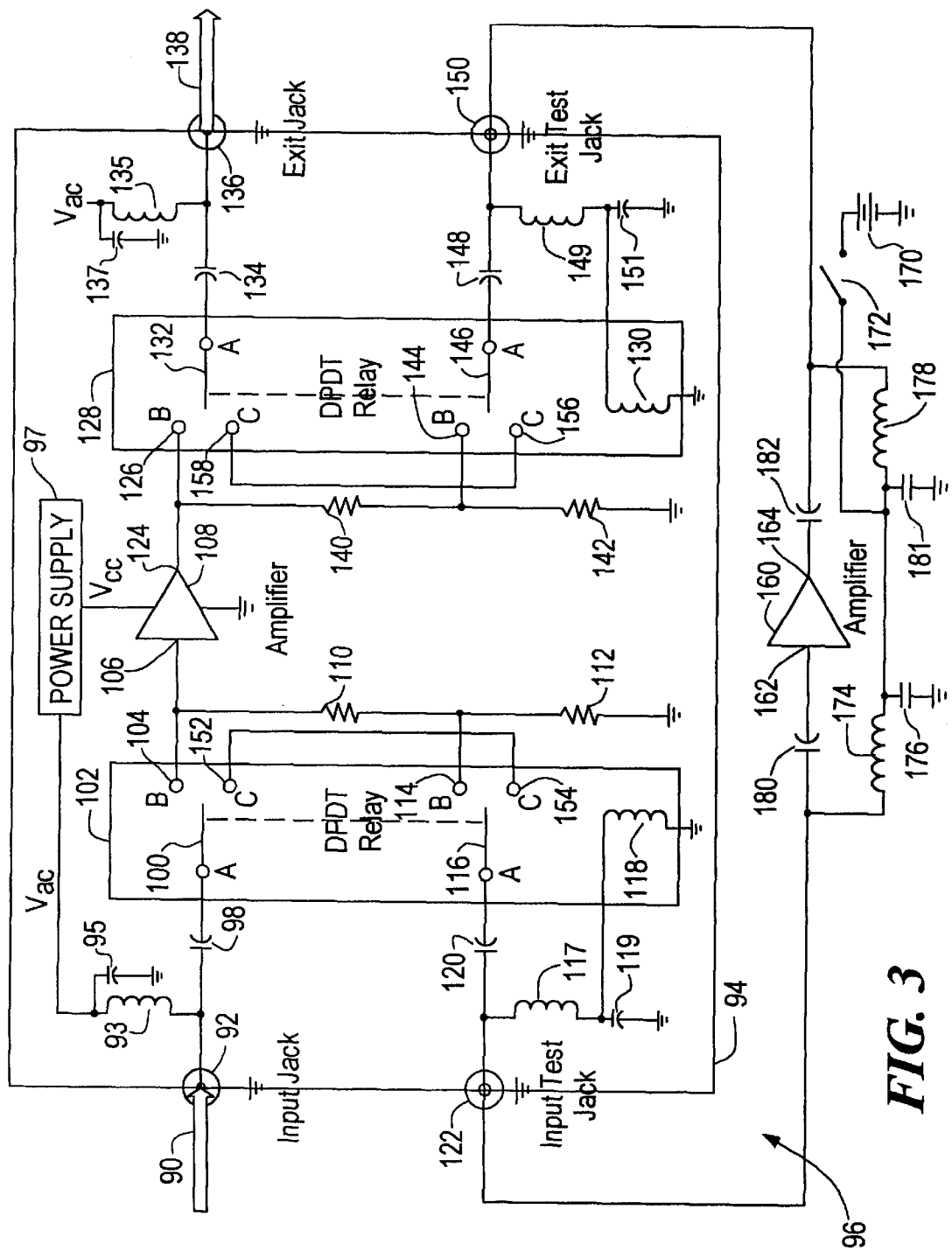

In accordance with the present invention, referring to FIG. 3, an amplifier housing assembly and system are disclosed which permit the primary RF amplifier disposed within a housing to be bypassed, and a temporary amplifier to be rapidly substituted in its stead, so as to avoid significant disruption to the service of the downstream portions of the CATV network. Referring with particularity to FIG. 3, a CATV signal distributed over a coaxial cable 90 or other suitable media is coupled to an input jack 92 mounted on a housing 94 of the RF broadband amplifier assembly 96. The CATV signal at the input jack is coupled to one end of an ac coupling capacitor 98. The other end of the coupling capacitor 98 is coupled to a first switching arm (A) 100 of a DPDT switch which may comprise a mechanical switch such as a DPDT RF relay or alternatively, an electronic switch operative to perform the switching function described herein. Switching arm 100 is normally connected to switch contact B labelled 104 to couple the CATV signal to the input 106 of the RF broadband amplifier 108. As shown in FIG. 3, the input 106 of the broadband amplifier 108 is also coupled to a resistor 110 which in turn is coupled to ground through a resistor 112. Resistors 110 and 112 form a voltage divider. The output of the voltage divider is coupled to switch contact B labelled 114 which is normally connected (when the relay 102 coil 118 is unpowered) to a second switching arm A 116 of the DPDT relay 102. The second switching arm A 116 is coupled to one end of a coupling capacitor 120. The other end of the coupling capacitor 120 is coupled to an input test jack 122 mounted on the housing or chassis 94. Thus, when the relay coil 102 of the DPDT relay 102 is unpowered and switching arms A are making electrical contact with respective contacts B, the CATV input signal is coupled to the input 106 of the CATV amplifier 108 and a reduced replica of the CATV input signal formed by the resistive voltage divider 110, 112, is presented at the input test jack 122.

The output 124 of the RF broadband amplifier 108 is coupled to one contact B 126 of a second DPDT relay 128 mounted within the housing or chassis 94. The second DPDT relay, like the first DPDT relay, has switching arms A normally connected to relay contacts B when the respective relay coil 130 in unpowered. Thus, in its normal state, when the relay coil is unpowered, the first switching arm A 132 of the second DPDT relay 128 is coupled to the contact B 126. The first switching arm 132 of the relay 128 is coupled to one end of an ac coupling capacitor 134. The other end of the ac coupling capacitor 134 is coupled to an exit jack 136 mounted on the housing or chassis. The exit jack 136 is connected to a cable 138 to convey the CATV signal to downstream portions of the CATV network.

The output 124 of the RF broadband amplifier 108 is also coupled to one end of a resistor 140. The other end of the resistor 140 is connected to one end of a resistor 142, the other end of which is connected to ground. The output of the voltage divider at the connection of resistors 140 and 142 is coupled to contact B 144 of the DPDT relay 128. When the relay coil 130 of the second DPDT relay is unpowered, the second switching arm A 146 is connected to the relay contact B 144. As illustrated in FIG. 3, switching arm A 146 is also coupled to one end of an ac coupling capacitor 148. The other end of the coupling capacitor 148 is coupled to an exit test jack 150 which is mounted on the housing or chassis 94. Thus, when the relay coil 130 of the second DPDT relay is unpowered, a replica of the CATV signal on the output 124 of the RF broadband amplifier 108 may be monitored at the exit test jack 150. The signal presented at the exit test jack 150 is reduced in amplitude in accordance with the voltage divider formed by resistors 140 and 142.

When the relay coils 118 and 130 of the respective DPDT relays 102 and 128 are energized, the relays are placed in a second switch state in which respective switching arms A are coupled to respective contacts C of the first and second relays. In this switching state, the RF broadband amplifier 108 is decoupled from the CATV network, the input jack 92 is coupled to the input test jack 122 and the exit test jack 150 is coupled to the exit jack 136. Accordingly, in the state, a bypass RF broadband amplifier may be substituted in the CATV network for the RF broadband amplifier 108 by connecting the input of a substitute RF amplifier 160 to the input test jack 122 and by connecting the output of bypass RF broadband amplifier to the exit test jack 150.

More specifically, again referring to FIG. 3, when the relay coil 118 of the first DPDT relay 102 is energized, the switching arms A of the relay 102 are connected to contacts C of the relay. Thus, the received CATV signal is conveyed via the switching arm A to the first contact C 152 of the relay 102. The first contact C 152 is connected to the second contact C 154 of the relay 102. Thus, the input jack 92 is directly AC coupled to the input test jack 122 when the relay coil is energized.

Similarly, when the relay coil 130 of the second DPDT relay 128 is energized, the switching arms A of the relay 128 are connected to contacts C of the relay. Thus, when the relay coil 130 is energized, the switching arms A couple an RF signal presented to the exit test jack 150 directly to the exit jack 136 via contacts C labelled 156 and 158 respectively.

When it is desired to decouple the internal RF broadband amplifier 108 from the CATV network for analysis, replacement or repair, the input 162 and output 164 of a bypass or substitute RF broadband amplifier 160 may be coupled to respective input and exit test jacks 122 and 150 of the RF amplifier assembly 96 and the relay coils 118 and 130 energized to switch the bypass RF amplifier 160 into the CATV network in place of the existing amplifier 108. It will be appreciated that it will be typically be desirable to substitute for the internal RF amplifier 108, a bypass amplifier 160 having comparable gain, frequency and impedance characteristics. In the foregoing manner, the internal amplifier(s) 108 may be repaired, tested or replaced without disruption of service to the subscribers downstream of the amplifier 108 being decoupled from the network.

A battery may be employed to energize the respective relay coils by application of the appropriate DC voltage to the input test jack 122 and the exit test jack 150. More specifically, referring to FIG. 3, a battery provides a DC voltage source. The DC voltage from the battery 170 is coupled through a switch 172, and an inductor 174 to the input test jack 122. An external capacitor 176 provides high frequency decoupling. The DC voltage is further coupled from the input test jack 122 to the relay coil 118 through an inductor 117. An additional decoupling capacitor 119 filters undesirable high frequency components from the DC voltage. Additionally, the DC voltage from the battery 170 is coupled through the switch 172, and an inductor 178 to the exit test jack 150. The DC voltage is further coupled from the exit test jack 150 to the relay coil 130 through an inductor 117. A decoupling capacitor 151 filters undesirable high frequency components from the DC voltage powering the relay coil 130. Capacitors 180 and 182 permit the high frequency CATV signal to be coupled the input and from the output of the amplifier 160 respectively while isolating the input and output of the amplifier from the DC voltage introduced via the battery 170.

It should be understood that power for the relays may alternatively be obtained from the low frequency AC component of the CATV signal or the output of the power supply 97. In the event that the relays are powered by an AC power source AC relays are employed. When the relays are powered by a DC power source, such as Vcc or the battery 170, DC relays are employed.

The foregoing modification to conventional RF broadband amplifier assemblies will greatly facilitate the service of CATV networks, by minimizing the need to perform elective service on an off hour basis and by minimizing extended and disfavored disruption of CATV service which poses a substantial annoyance to subscribers. In particular, it is noted that the presently disclosed switching circuit may be incorporated within CATV amplifier housings which typically already have input and exit jacks and associated input and exit test jacks and permit the utilization of such test jacks for the dual functions described above.

While the invention has been described with respect to a RF amplifier assembly having a single amplifier contained within the housing 94, a plurality of amplifiers may be contained within such a housing or chassis with one switching circuit provided for each input/exit jack and input test/exit test jack pair.

It will further be appreciated by those of ordinary skill in the art that other modifications of and departures from the subject matter disclosed herein will be readily apparent without departing from the presently disclosed inventive concepts. Accordingly, the invention disclosed herein is not to be viewed as limited except as by the scope and spirit of the appended claims.

I claim:

1. For use in a CATV network having a plurality of broadband amplifiers, wherein each of said broadband amplifiers has an input and an output and wherein each of said broadband amplifiers has a network portion upstream of the respective broadband amplifier input and a network portion downstream of the respective broadband amplifier output, apparatus for decoupling one of said plurality of broadband amplifiers from said CATV network while providing continued service to the respective downstream portion of said network comprising:

at least one switching circuit having a first switching state and a second switching state;

a bypass broadband amplifier having an input selectively coupled through said switching circuit to said input of said one of said plurality of broadband amplifiers and an output selectively coupled through said switching circuit to said output of said one of said plurality of broadband amplifiers;

said at least one switching circuit being operative to couple said input and said output of said one of said plurality of broadband amplifiers to the respective upstream and downstream portions of said CATV network and to couple said input and output of said bypass broadband amplifier to the respective upstream and downstream portions of said CATV network when said at least one switching circuit is in said first switching state; and said at least one switching circuit being operative to decouple said input and said output of said one of said plurality of broadband amplifiers from the respective upstream and downstream portions of said CATV network and to couple said input and output of said bypass broadband amplifier to the respective upstream and downstream portions of said CATV network when said at least one switching circuit is in said second switching state;

whereby switching said switch from said first switch state to said second switch state causes said bypass broadband amplifier to maintain service to the respective downstream portion of said CATV network when said one of said plurality of broadband amplifiers is decoupled from said CATV network.

2. The apparatus of claim 1 wherein said at least one switching circuit comprises at least one DPDT relay.

3. The apparatus of claim 1 wherein said at least one switching circuit comprises an electronic switching circuit.

4. For use in a CATV network having a plurality of broadband amplifiers, wherein each of said broadband amplifiers has an input and an output and wherein each of said plurality of broadband amplifiers has a network portion upstream of the respective broadband amplifier input and a network portion downstream of the respective broadband amplifier output, a switching assembly for decoupling one of said plurality of broadband amplifiers from said CATV network and for maintaining service to the respective downstream portion of said CATV network, said switching assembly comprising:

a CATV amplifier housing having an input port for receiving a CATV signal from said upstream portion of said network, an output port for coupling a CATV signal to said downstream portion of said network, an input test port and an output test port;

an internal RF broadband amplifier disposed within said housing, said internal RF broadband amplifier having an input and an output, at least one switching circuit disposed within said housing, having a first switching state and a second switching state, in said first switching state, said switching circuit being operative to electrically couple said input port to the input of said internal RF broadband amplifier, to electrically couple said output of said internal RF broadband amplifier to said output port, to couple said input of said internal RF broadband amplifier to said input test port and to couple said output of said internal RF broadband amplifier to said output test port so as to include said RF broadband amplifier in said CATV network and provide reduced amplitude replicas of said CATV signals at said input and output of said internal RF broadband amplifier at said input and output test ports respectively;

in said second switching state, said switching circuit being operative to decouple said input port from said input of said internal RF broadband amplifier, to decouple said output of said internal RF broadband amplifier from said output port, to decouple said input of said internal RF broadband amplifier from said input test port, to decouple said output of said internal RF broadband amplifier from said output test port, to couple said input port to said input test port and to couple said output test port to said output port.

5. The switching assembly of claim 4 wherein said switching assembly further includes an external RF broadband amplifier having an input and an output, said input of said external RF broadband amplifier being coupled to said input test port and said output of said external RF broadband amplifier being coupled to said output test port such that said external RF broadband amplifier receives said CATV signal from said input port and provides an amplified CATV signal to said output port when said switching circuit is in said second switching state.

6. The switching assembly of claim 4 wherein said switching assembly circuit comprises at least one relay.

7. The switching assembly of claim 6 wherein said at least one relay includes at least one DPDT relay.

8. The switching assembly of claim 4 wherein said switching assembly further includes an input voltage divider circuit having an input and an output and an output voltage divider circuit having an input and an output, said input of said input voltage divider circuit being coupled to said input of said internal RF broadband amplifier and said input of said output voltage divider circuit being coupled to said output of said internal RF broadband amplifier, said switching circuit being operative in said first switching state to couple the output of said input voltage divider circuit to said input test port and to couple the output of said output voltage divider circuit to said output test port to present reduced amplitude replica CATV signals at said input and output of said internal RF broadband amplifier at said input and output test ports respectively; and said switching circuit being operative in said second switching state to decouple the output of said input voltage divider circuit from said input test port and to decouple the output of said output voltage divider circuit from said output test port.

9. A method for decoupling from a CATV network a first broadband amplifier having an amplifier input and an amplifier output, wherein said network has portions upstream of said first broadband amplifier input and portions of said network downstream of said first broadband amplifier output, so as to avoid interruption of service in said portions of said network downstream of said first broadband amplifier output while said first broadband amplifier is decoupled from said network comprising the step of:

activating a switching circuit which is operative to decouple said first broadband amplifier input and a second broadband amplifier input from said upstream portion of said CATV network, to decouple said first broadband amplifier output and a second broadband amplifier output from said downstream portion of said network, to couple the input of the second broadband amplifier to said upstream portion of said network, and to couple the output of said second broadband amplifier to said downstream portion of said network so as to provide continued service to said downstream portion of said CATV network while said first broadband amplifier is decoupled from said CATV network.

10. The method of claim 9 wherein said first broadband amplifier is disposed in a CATV amplifier housing having an input port for receiving a CATV signal normally coupled to said input of said first broadband amplifier, an output port normally coupled to said output of said first broadband amplifier and for providing an amplified CATV signal to said downstream portion of said network, an input test port normally coupled to said input of said first broadband amplifier and an output test port normally coupled to said output of said first broadband amplifier, wherein said second broadband amplifier input is coupled to said input test port and wherein said broadband amplifier output is coupled to said output test port, and wherein said activating step further includes the steps of:

decoupling said input port from the input of said first broadband amplifier;

decoupling said input of said first broadband amplifier from said input test port;

decoupling said output of said first broadband amplifier from said output port;

decoupling said output of said first broadband amplifier from said output test port;

coupling said input port to said input of said second broadband amplifier by coupling said input port to said said first input test port; and coupling said output of said second broadband amplifier to said output port by coupling said output test port to said output port.

* * * * *